United States Patent [19]

Voisine et al.

[11] Patent Number: 4,998,061
[45] Date of Patent: Mar. 5, 1991

[54] WATTHOUR METER WITH TEMPERATURE COMPENSATION FOR WYE CONNECTED SYSTEMS

[75] Inventors: John T. Voisine, Lafayette, Ind.; Robby F. Hausegger, Hausen d/A, Switzerland

[73] Assignee: Landis & Gyr Metering, Inc., Lafayette, Ind.

[21] Appl. No.: 451,047

[22] Filed: Dec. 15, 1989

Related U.S. Application Data

[62] Division of Ser. No. 99,120, Sep. 21, 1987, Pat. No. 4,896,106.

[51] Int. Cl.$^5$ .................. G01R 21/06; G01R 1/44
[52] U.S. Cl. .................................. 324/142; 324/105
[58] Field of Search .............. 324/142, 105, 99 D, 324/157, 107, 141

[56] References Cited

U.S. PATENT DOCUMENTS

| | | | |
|---|---|---|---|
| 4,182,983 | 1/1980 | Heinrich et al. | 324/142 |
| 4,359,684 | 11/1982 | Ley | 324/142 |
| 4,591,810 | 5/1986 | Mackenzie et al. | 324/142 |

Primary Examiner—Ernest F. Karlsen
Attorney, Agent, or Firm—Woodard, Emhardt, Naughton Moriarty & McNett

[57] ABSTRACT

A watthour meter, preferably for a wye connected load, includes a current transformer for sensing the load current, a resistive voltage divider network for sensing the line voltage, and a measuring circuit for calculating the AC electrical energy consumption of the load based on the sensed load current and line voltage. The load consumption calculations are performed using a Mark-Space oscillator and amplitude modulator in the watt transducer chip. Reduced voltage from the resistive voltage divider network is fed into the input junction of the Mark-Space oscillator. A feedback resistor is connected from the output junction to the input junction of the oscillator. The feedback resistor and the voltage divider network are mounted on the same thermally conductive substrate so that each are subject to the same thermal effects. Thus, any change, due to thermal effects, in the current through the voltage divider network seen at the input junction to the Mark-Space oscillator are compensated by a current change through the feedback line due to thermal effects on the feedback resistor. The watthour meter also includes a electronic register that receives the load consumption information from the watt transducer chip. The register is electrically isolated from the watt transducer chip and, therefore, from the voltage divider network, by an opto-isolator to reduce the possibility of electrical shock at the register. Power is provided to the watt transducer chip and the electronic register from the split secondary coils of a power transformer.

3 Claims, 2 Drawing Sheets

WATTHOUR METER WITH TEMPERATURE COMPENSATION FOR WYE CONNECTED SYSTEMS

This application is a division, of application Ser. No. 099,120, filed 9/21/87 now U.S. Pat. No. 4,896,10.

BACKGROUND OF THE INVENTION

The present invention relates to watthour meters for measuring AC electrical energy consumption by a load. More particularly, the invention relates to improvements in sensing line voltage in solid-state watthour meters.

Electronic or solid-state watthour meters have been known since the early 1970's. In meters of this type, the load current and line voltage are sensed and corresponding current and voltage signals are input into an integrated circuit chip. The current and voltage signals are multiplied within the measurement chip to produce an output signal corresponding to the AC electrical energy consumption by the load. This output signal is supplied to a register that converts this signal to a readable display. In more recent years, solid-state registers have become more sophisticated to include custom integrated circuits to perform usage and load profile calculations.

In the watthour meters of the prior art, voltage and current sensing have been performed using voltage or current transformers. These transformers reduce the voltage and current from the AC source to levels compatible with the solid-state components of the meter. The transformers also provide electrical isolation of the meter from the AC source to minimize the risk of accidental electrical shock. However, transformers, and particularly voltage transformers, are bulky and expensive. Moreover, transformer losses and phase errors reduce accuracy and frequently require additional circuitry to compensate for these errors.

It is, therefore, an object of the present invention to provide a watthour meter with means to sense the line voltage across an AC power source that is highly accurate, but at a lower cost than the voltage transformers of the prior art. It is a further object to provide means to sense line voltage that presents a smaller physical package than a voltage transformer. Another object is to provide means to electrically isolate the user accessible components of this watthour meter from the voltage and current of the AC power source. Yet another object is to provide novel means to feed electrical power, derived from the AC power source, to the user accessible components, while preserving the electrical isolation required for safety. Other objects of the invention will be made apparent from the following disclosure and accompanying figures.

SUMMARY OF THE INVENTION

In accordance with the present invention, a watthour meter for registering AC electrical energy consumption by a load connected to a source of AC load current and AC line voltage, includes a current transformer for producing a first signal in relation to the AC load current and a resistive voltage divider electrically connected at its input to the AC source and producing at its output a second signal in relation to the AC line voltage. The watthour meter further includes a measuring circuit, accepting at its input the first and second signals, and producing at its output a third signal corresponding to the AC electrical energy consumption.

The measuring circuit may include a Mark-Space oscillator employing a feedback resistor. The feedback resistor is mounted on the same thermally conductive substrate as the resistive voltage divider network providing AC input to the Mark-space oscillator, to compensate for temperature effects on the divider network.

In accordance with another embodiment of the invention, the watthour meter described above includes a solid state register that receives power consumption signals from the measuring circuit. An opto-isolator is provided between the register and the measuring circuit to provide electrical isolation while transmitting the power consumption signals. A power supply provides power from the AC source to the measuring circuit and the register. The power supply includes a split secondary having one secondary providing power to a voltage regulator for the measuring circuit. A second secondary provides power to the register.

DESCRIPTION OF THE PREFERRED EMBODIMENT

Figure 1:
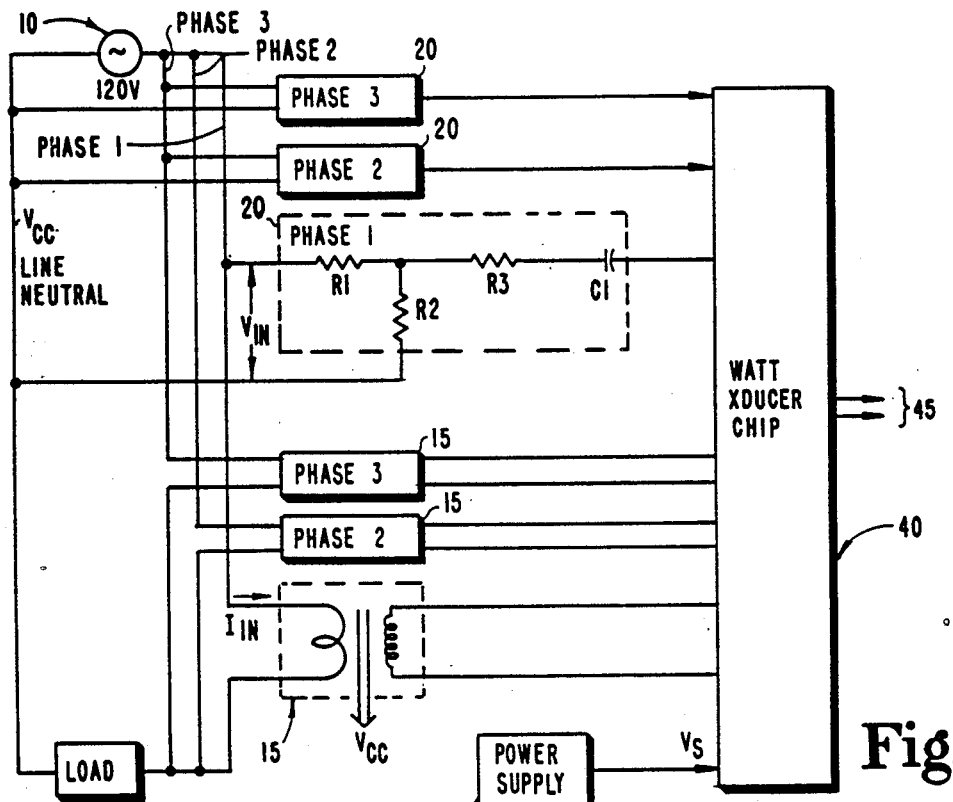
FIG. 1 is a schematic diagram of the watthour meter using a resistive voltage divider network to sense AC line voltage of a first embodiment of the present invention.

For the purposes of promoting an understanding of the principles of the inventions, reference will now be made to the embodiment illustrated in the drawings and specific language will be used to describe the same. It will nevertheless be understood that no limitation of the scope of the inventions is thereby intended, such alterations and further modifications in the illustrated device, and such further applications of the principles of the inventions as illustrated therein being contemplated as would normally occur to one skilled in the art to which the inventions relates.

The watthour meter of the preferred embodiment is connected across a source of alternating current 10 as shown in FIG. 1. In the preferred embodiment, the AC source is a three-phase 120 volt source with the load and watthour meter connected in a wye configuration having a line neutral potential, $V_{cc}$ as referenced in the figures. Only one phase of the three-phase circuitry is shown in the accompanying figures, the remaining phases being accounted for in a similar manner within the present watthour meter. It is understood that the present invention may be practiced in single phase and polyphase electrical systems alike.

In the preferred embodiment, a current transformer 15 senses the AC current through the load from the AC power source 10. The voltage is sensed by way of the resistive voltage divider network 20, rather than the voltage transformer typical in prior art watthour meters. A suitable resistive voltage divider network would be a low inductance, high voltage impulse tolerant, flat packaged network, such as is marketed by Caddock Electronics, Inc., Riverside, Calif. The voltage and current signals from the resistive voltage divider network 20 and the current transformer 15, respectively, are input into a measurement circuit, such as embodied in watt transducer chip 40. Watt transducer chip 40 is an integrated circuit that accepts the voltage and current signals to produce output signals 45 that are proportional to the AC electrical energy consumed by the load.

The resistive voltage divider network 20 comprises resistors R1, R2 and R3, that are selected to reduce the 120 volts of the AC power source 10 to a voltage compatible with the solid state circuitry, such as the watt transducer chip 40, upstream of the resistive voltage divider network 20. Resistor R1 is connected in series with the AC source 10 and has a large resistance value to ensure a small current through voltage divider network 20. Resistors R2 and R3 are parallel resistors connected in series with resistor R1, with R2 shunted to line neutral potential $V_{cc}$, to complete the voltage divider network. In the preferred embodiment, for a 120 volt AC line input, R1 has a value of 1M-ohm, R2 has a value of 100K-ohms, and R3 has a value of 454.5K-ohms. With these values of R1, R2 and R3, the voltage from the 120 volt AC supply is reduced to a level compatible with the solid state components of watt transducer chip 40, in the range of nine volts.

A capacitor C1 is provided in series with R1 of the resistive voltage divider network 20 to form a series RC network. This network shifts the phase of the input voltage signal slightly to match the phase error in the current sensing current transformer 15 generated by the magnetic material of the transformer. Capacitor C1 is installed for easy replacement should compensation for phase error be required. Compensation for phase error is important to keep the power factor error of the watthour meter to a minimum. The capacitance value of a capacitor to replace capacitor C1 is, therefore, related to the power factor error. In the preferred embodiment, for a 120 V AC source, the replacement capacitance equals the reciprocal of the sum of 1.2 times the power factor error and the inverse of the original capacitance for capacitor C1.

The resistive voltage divider network 20 of the present invention supplants the traditional voltage transformer as a means to sense line voltage in a watthour meter. This method of voltage sensing is more accurate and less expensive than a voltage transformer. Moreover, the voltage divider network 20 allows for a physically smaller package than a voltage transformer that is more easily located within a watthour meter.

In a second embodiment of the present invention, illustrated with reference to FIG. 2, a resistive voltage divider network 70 is connected across an AC power source 60. Voltage divider network 70 is, in all respects, similar to voltage divider network 20 described above. For simplicity, the divider network has been defined in terms of an equivalent resistance 71 in series with a capacitor 72, which is similar to capacitor C1 described above. The watthour meter of this second embodiment further includes a current transformer 65 for sensing the current drawn by the load from AC power source 60. Watt transducer chip 80 receives voltage and current signals from the voltage divider network 70 and the current transformer 65 to produce output signals 90 corresponding to the AC energy consumption of the load. Watt transducer chip 80 is fed by a power supply 81 that provides a supply voltage $V_s$ to the chip 80. The watt transducer chip 80 performs solid state measurement of the power consumption based upon a technique known as Time Division Multiplication. As is known in the art, Time Division Multiplication is a technique where the width (or time) of a signal (the duty cycle) is made proportional to the line voltage and the height of the signal is made proportional to the load current. Watt transducer chip 80 sums the power consumption data for each of the three phases to generate a total power consumption output.

Figure 2:
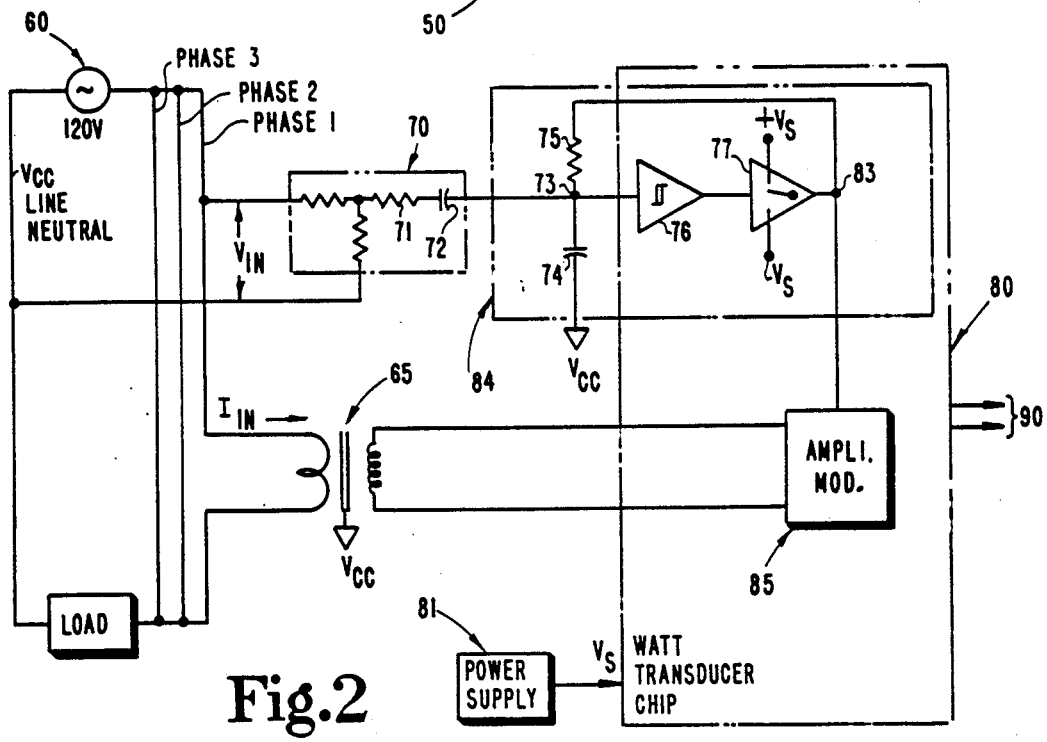
FIG. 2 is a schematic diagram of the watthour meter having a feedback resistor for temperature compensation in a second embodiment of the present invention.

To perform this Time Division Multiplication, the watt transducer chip 80 includes a Mark-Space oscillator 84, designated in phantom in FIG. 2, that produces a duty cycle modulated signal at output junction 83 that is fed to an amplitude modulator 85. The AC load current sensed by current transformer 65 is also fed into amplitude modulator 85. The output from amplitude modulator 85 represents the AC power consumption by the load. The principles of operation of the Mark-Space oscillator 84 and the amplitude modulator 85 are well-known in the art.

In applicant's second embodiment, the Mark-Space oscillator 84 includes a feedback resistor 75. The feedback resistor 75 is connected between the output junction 83 and the input junction 73 of the Mark-Space oscillator 84. The voltage input from resistive voltage divider network 70 is fed into the Mark-Space oscillator 84 at input junction 73. A capacitor 74 is shunted from input junction 73 to the line neutral potential $V_{cc}$. Comparator 76 and operational amplifier 77 are connected in series between input junction 73 and the output junction 83. Op amp 77 is provided with inputs for positive and negative supply voltage $V_s$ generated by power supply 81.

In the operation of the Mark-Space oscillator 84, positive supply voltage $+V_s$ charges capacitor 74 through feedback resistor 75. Capacitor 74 is also charged by the small positive current through the resistive voltage divider network 70. When the voltage on capacitor 74 reaches a threshold value, the comparator 76 causes op amp 77 to switch to the negative supply voltage $-V_s$. Capacitor 74 is then is discharged by the negative supply voltage through the feedback resistor 75. When the voltage on capacitor 74 reaches its negative threshold, the output of op amp 77 switches to the positive supply voltage $+V_s$. During the discharge of capacitor 74, the rate of discharge is slower than the rate of charging due to the presence of the small positive input current from the voltage divider network 70.

During the operation of the Mark-Space oscillator 84, the capacitor 74 is charged and discharged through the feedback resistor 75. In addition, the rate of charging or discharging of capacitor 74 is affected by output from the voltage divider network 70. The use of this separate feedback resistor 75 provides a means for accounting for the thermal effects on the voltage divider network 70. In this second embodiment, feedback resistor 75 is mounted on the same thermally conductive substrate as the resistors comprising the voltage divider network 70. Thus, any change in temperature experienced by the voltage divider network 70 will also be experienced by the feedback resistor 75.

In operation, as the temperature seen by voltage divider network 70 increases, the current through the network 70 entering input junction 73 decreases. When exposed to the same change in temperature, the resistance of feedback resistor 75 increases proportionately and the current through the feedback resistor 75 decreases by an amount sufficient to offset the decreased current through the resistive voltage divider network 70 seen at the same junction. Conversely, a temperature decrease will increase the current through the voltage divider network, but the current through the feedback resistor 75 will also increase by a proportionate amount. Thus, regardless of the change in temperature, capacitor 74 maintains a constant ratio of charging time to discharging time and the effective output from the Mark-Space oscillator 84 to the amplitude modulator 85 is only minimally affected with respect to its ratio of high to low voltage time periods (i.e., the duty cycle). In the present embodiment, the value of feedback resistor 75 is 100K-ohms to be compatible with the equivalent resistance 71 of the voltage divider network 70. The thermal properties of the feedback resistor 75 and the voltage divider resistors are also nearly equivalent to ensure that each are comparably affected by temperature changes.

The use of a voltage divider network, such as networks 20 and 70 of the previous embodiments, to sense the voltage from the AC power source, eliminates the electrical isolation inherent with the voltage transformers used in the prior art devices. In a watthour meter, it is important that the components accessible to the customer or meter-reader be isolated from the AC current and voltage to the load. With the use of a voltage divider network to sense the voltage, the risk exists that unsafe voltages could be applied to the line neutral terminal, thus creating an electrical shock hazard for the user. To account for this risk, an electrical isolator is interposed between the watt transducer chip and the components that are exposed to the customer or meter-reader. In a third embodiment of the present invention, illustrated in FIG. 3, a watt transducer chip 100 receives inputs from a voltage divider network 105 and a current transformer 110 that are, in all respects, identical to the voltage divider network and current transformers discussed above. A voltage $V_s$ is supplied by power supply 115. A watt transducer chip 100 produces output signals 120 corresponding to the AC energy consumption by the load. These output signals 120 can be displayed or further conditioned by user-accessible register 125. Register 125 could comprise a plurality of display LED's and custom integrated circuit chips to perform a variety of operations on the energy consumption signals to calculate, for instance, time of use and load profile information. The register 125 is exposed to the user who may desire to read information from the LED's or I.C.s, or to enter information into programmable custom integrated circuit chips. In order to minimize the risk of accidental electrical shock through the register 125, electrical isolator 130 is interposed between watt transducer chip 100 and the register 125.

Figure 4:
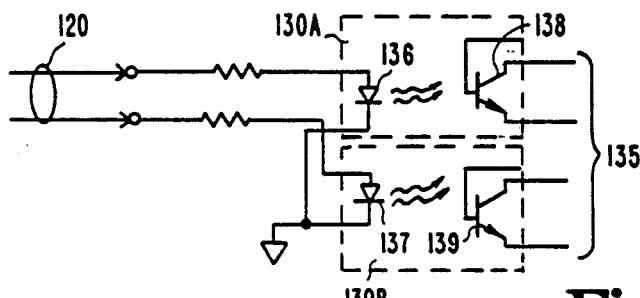
FIG. 4 is an enlarged schematic diagram of the electrical isolation of the third embodiment illustrated in FIG. 3.

In the preferred embodiment, electrical isolator 130 includes a pair of opto-isolators 130A and 130B, corresponding to each of the pair of output signals 120 from watt transducer chip 100, as illustrated with reference to FIG. 4. Each opto-isolator includes a light emitting diode 136 and 137, respectively. Responsive to the optical signals from the LED's are a pair of photosensitive transistors 138 and 139 in opto-isolators 130A and 130B, respectively. These transistors 138 and 139 transmit a signal 135 to register 125 corresponding to the signal 120 received by the LEDs 136 and 137. In the preferred embodiment, opto-isolators 130A and 130B are available from Motorola as Model MOC 8100.

It will be noted that electrical isolator 130 is not made necessary by the current sensing portion of the present watthour meter, because a current transformer 110 is employed that inherently provides electrical isolation. However, relative to the voltage sensing portion of the watthour meter, use of the opto-isolator 130 of the present embodiment provides the electrical isolation typically offered by a voltage transformer. Thus voltage sensing in the watthour meter may be accomplished by a resistive voltage divider network, such as network 105. The opto-isolators 130A and 130B, in combination with the voltage divider network 105 reduces the space requirements in the watthour meter and reduces the overall cost of the meter from meters using the prior art voltage transformer.

Figure 3:
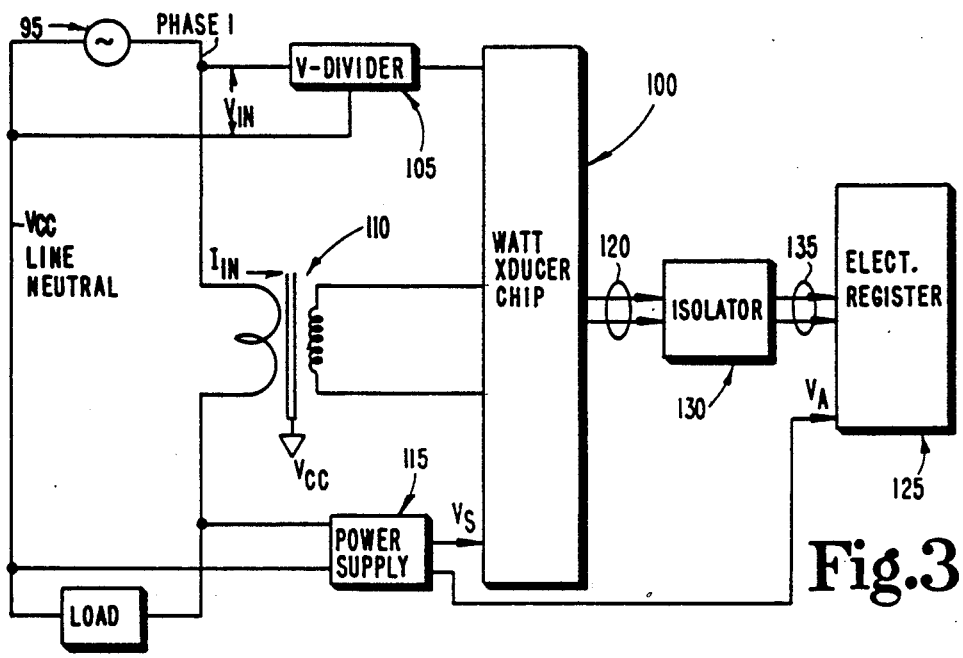
FIG. 3 is a schematic diagram of the watthour meter with electrical isolation between the user-accessible register and the measurement circuit in a third embodiment of the present invention.

Register 125 requires a power supply to power the photosensitive transistors 138 and 139, and the variety of LED's and integrated circuit chips that may be included in the register 125. However, since register 125 is electrically isolated from the AC power source 95 by way of electrical isolator 130, it must either have a separate power source, such as a battery, or some other external source of power. If sophisticated time of use and load profile calculations are to be made within register 125, some timing signal coupled to the frequency of the AC power supply 95 may be required. Thus, it is preferable that the power supply to register 125 be derived directly from the AC source 95. In the present embodiment, power to the register 125 is provided by power supply 115 as voltage $V_a$, as shown in FIG. 3.

Figure 5:
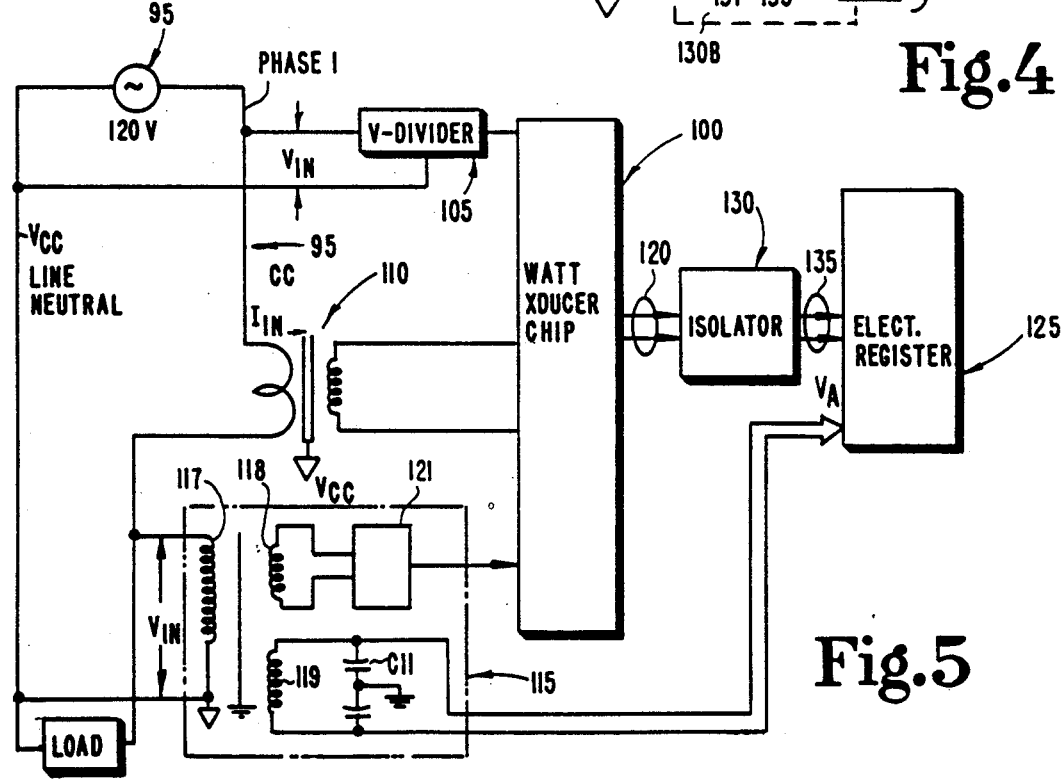
FIG. 5 is a schematic diagram of the watthour meter of FIG. 3 with a schematic representation of the power supply of a fourth embodiment of the present invention.

The details of power supply 115 are illustrated more clearly in FIG. 5. Power supply 115 comprises a voltage transformer 116 having a primary coil 117 and a pair of secondary coils 118 and 119. The primary coil 117 is wired across the AC source 95 to the line neutral potential $V_{cc}$. In the three-phase electrical system of the preferred embodiment, the primary coil 117 is wired across one phase. The first secondary coil 118 is coupled to voltage regulator 121 which provides the voltage $V_s$ to watt transducer chip 100, as previously described. The second secondary coil 119 derives the voltage $V_a$ that is provided to the register 125. A pair of capacitors C11 and C11a, each tied at one end to ground, are provided for conducted radio frequency interference and impulse voltage protection.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A watthour meter for registering AC electrical energy consumption by a load connected to a source of AC load current and AC line voltage, comprising:
   current sensing means for producing a first signal in relation to the AC load current;
   voltage sensing means for producing a second signal in relation to the AC line voltage, said voltage sensing means being mounted on a thermally conductive substrate; and measuring circuit means for operating on said first and said second signals to produce an output signal corresponding to the AC electrical energy consumption said measuring circuit means including temperature compensating means having a resistor mounted on said thermally conductive substrate for compensating for temperature effects on said voltage sensing means.

2. The watthour meter according to claim 1, wherein: said measuring circuit includes a Mark-Space Oscillator electrically connected at its input to said voltage sensing means to receive said second signal and having a feedback loop from its output to its input; said temperature compensating means includes said resistor being interposed in said feedback loop; and further wherein variations of said second signal due to temperature effects on said voltage sensing means are compensated at said input to said Mark-Space Oscillator by variations in current through said resistor due to said temperature effects.

3. The watthour meter according to claim 1, wherein said voltage sensing means comprises a resistive voltage divider network including several resistors mounted on said thermally conductive substrate.

* * * * *